(12) United States Patent
Nakahara

(10) Patent No.: US 7,834,669 B2
(45) Date of Patent: Nov. 16, 2010

(54) SEMICONDUCTOR OUTPUT CIRCUIT FOR CONTROLLING POWER SUPPLY TO A LOAD

(75) Inventor: Akihiro Nakahara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 3 days.

(21) Appl. No.: 12/314,420

(22) Filed: Dec. 10, 2008

(65) Prior Publication Data

US 2009/0160498 A1 Jun. 25, 2009

(30) Foreign Application Priority Data

Dec. 21, 2007 (JP) .............................. 2007-329472
Nov. 18, 2008 (JP) .............................. 2008-294518

(51) Int. Cl.
*H03B 1/00* (2006.01)
(52) U.S. Cl. ..................................... 327/108
(58) Field of Classification Search ................. 327/108, 327/109, 110, 111
See application file for complete search history.

(56) References Cited

U.S. PATENT DOCUMENTS 5,272,399 A * 12/1993 Tihanyi et al. .............. 327/379
5,352,932 A 10/1994 Tihanyi
5,910,738 A * 6/1999 Shinohe et al. ............. 327/108
5,914,619 A * 6/1999 Tihanyi ...................... 327/109

FOREIGN PATENT DOCUMENTS

| JP | 3-248619 | 11/1991 |
|---|---|---|
| JP | 6-188710 | 7/1994 |
| JP | 2646786 | 5/1997 |

* cited by examiner

*Primary Examiner*—Jeffrey S Zweizig
(74) *Attorney, Agent, or Firm*—Foley & Lardner LLP

(57) ABSTRACT

Between a control terminal (gate) of an output transistor of a source follower configuration and an output terminal to which a load is coupled, a depletion transistor having a relatively lower breakdown voltage (that is, smaller device-area) is provided as a shutdown transistor of the output transistor, to thereby control a conductive state/nonconductive state of the depletion transistor. There are provided: the output transistor of the source follower configuration coupled between a first power supply line and the output terminal; the load coupled between the output terminal and a second power supply line; the depletion transistor coupled between the gate of the output transistor and the output terminal; and a control circuit controlling the conductive state/nonconductive state of the depletion transistor by applying, between a gate and a source thereof, a voltage smaller than a voltage deference between a potential of the first power supply line and a potential of the second power supply line.

19 Claims, 5 Drawing Sheets

FIG. 5

SEMICONDUCTOR OUTPUT CIRCUIT FOR CONTROLLING POWER SUPPLY TO A LOAD

BACKGROUND

1. Field of the Invention

The present invention relates to a semiconductor output circuit, and more particularly, to a semiconductor output circuit which controls power supply to a load.

2. Description of the Related Art

As a semiconductor output circuit using a source follower output transistor for supplying power to a load, for example, there is a circuit disclosed in Japanese Unexamined Patent Application Publication No. Hei 03-248619, which is equivalent to Japanese Patent No. 2646786 (B2) (hereinafter, referred to as Kanamori). The above-mentioned semiconductor output circuit is basically structured by coupling as a source follower an output transistor between a power supply line and an output terminal to which a load is coupled. Further, in order to keep a nonconductive state of the output transistor irrespective of voltage fluctuation occurring in the output terminal, a shutdown transistor is coupled between a gate and a source of the output transistor.

However, with the structure as described above, because the shutdown transistor is an enhancement type, a resistor for conductive bias is required between the gate and the source thereof, and a DC current (standby current) flows through the resistor even after the output transistor enters the nonconductive state.

As a semiconductor output circuit of another structure, there is a circuit disclosed in Japanese Unexamined Patent Application Publication No. Hei 06-188710, which is equivalent to U.S. Pat. No. 5,352,932 (hereinafter, referred to as Tihanyi), and in the semiconductor output circuit, a depletion transistor is used as the shutdown transistor.

A current flows through the depletion transistor even when its gate and source are at the same potential, and thus the standby current can be limited because the resistor which is required in Kanamori becomes unnecessary, which is more favorable.

However, the inventor has noticed the following problem. In Tihanyi, in the case where the depletion transistor serving as the shutdown transistor is caused to be in a conductive state, a power supply potential is supplied to its gate, and in the case where the depletion transistor is caused to be in a nonconductive state, a ground potential is supplied to its gate. This means that, as a result, the power supply voltage is applied between the gate and the source of the depletion transistor. Accordingly, in the case where the depletion transistor is used as the shutdown transistor, it is required to use a transistor having a higher breakdown voltage, namely, a transistor having a relatively larger device area. Therefore, the inventor has sought a semiconductor output circuit not using a device having a higher breakdown voltage but using a device having a lower breakdown voltage.

SUMMARY

A semiconductor output circuit according to an embodiment of the present invention includes: an output transistor of a source follower configuration coupled between a first power supply line and an output terminal to be coupled to a second power supply line through a load; and a depletion transistor coupled between a control terminal of the output transistor and the output terminal. A voltage applied between a gate and a source of the depletion transistor is smaller than a voltage difference between a potential of the first power supply line and a potential of the second power supply line when the output transistor is in a conductive state and a nonconductive state.

As a result, the voltage applied between a gate and a source for controlling the conductive state/nonconductive state of the depletion transistor is controlled not at a battery voltage level, but within a voltage range smaller than the battery voltage level, whereby a device having a relatively lower breakdown voltage can be used as the depletion transistor provided as a shutdown transistor.

As a control voltage for the depletion transistor, an intermediate voltage between the potential of the first power supply line and the potential of the second power supply line is preferably generated. In a case where the output transistor is in the conductive state, the gate of the depletion transistor is preferably applied a potential related to the intermediate voltage, while in a case where the output transistor is caused to be in the nonconductive state, an electrical short circuit is preferably caused between the gate and the source of the depletion transistor.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5 is a circuit diagram of a semiconductor output circuit 300 according to a third embodiment of the present invention.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described in detail with reference to the drawings.

Figure 1:
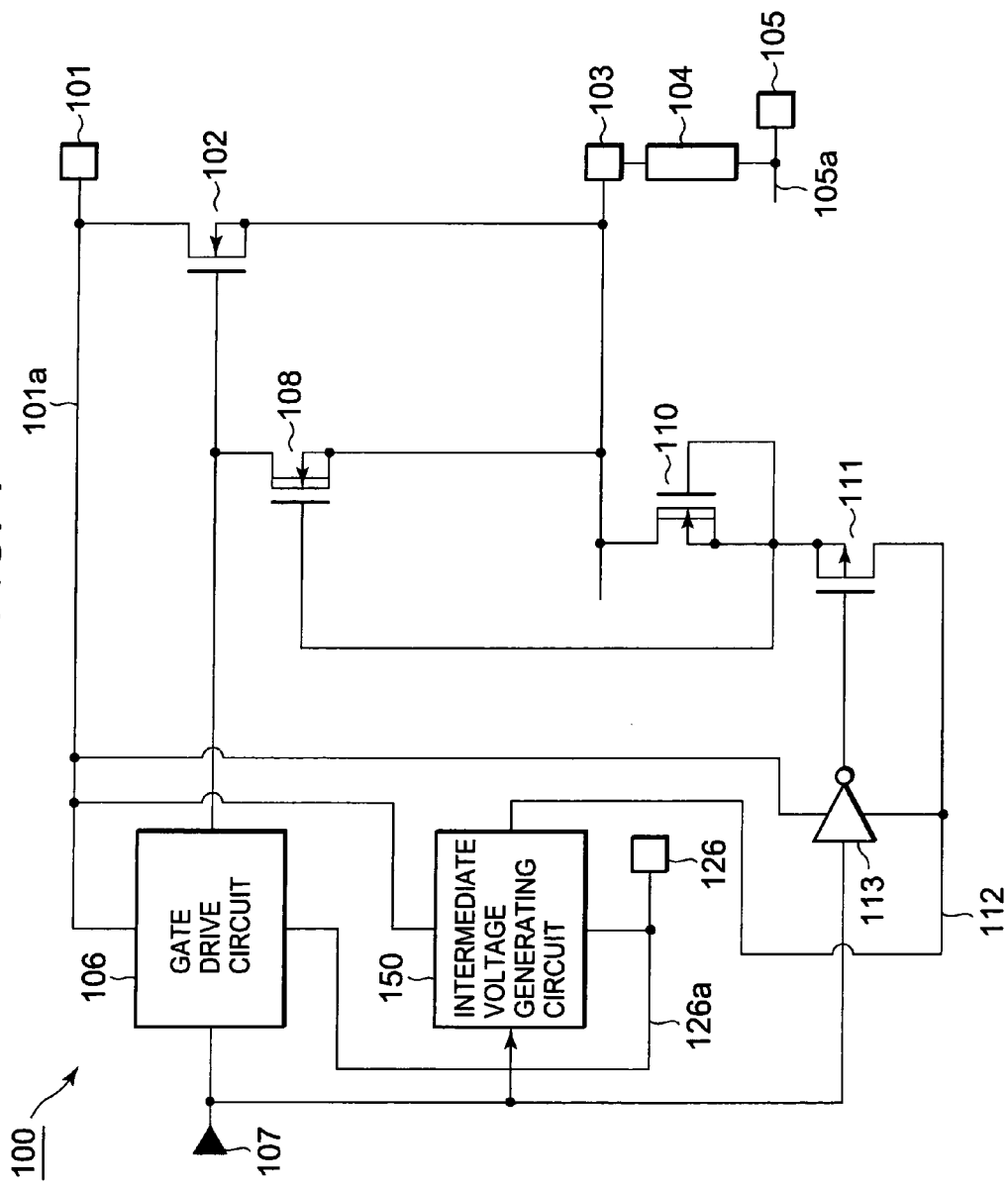
FIG. 1 is a circuit diagram of a semiconductor output circuit 100 according to a first embodiment of the present invention.

FIG. 1 illustrates a semiconductor output circuit 100 according to a first embodiment of the present invention, which is particularly a semiconductor output circuit excellent in application to automotive electrical components. A positive terminal of a battery is coupled to a first power supply terminal 101, and a negative terminal of the battery is coupled to a second power supply terminal 105, whereby a battery voltage (12 V, for example) as a power supply voltage is supplied. A first power supply line 101a and a second power supply line 105a are coupled to the first power supply terminal 101 and the second power supply terminal 105, respectively. A drain and a source of an n-channel enhancement output transistor 102 are coupled to the first power supply line 101a and an output terminal 103, respectively so that the n-channel enhancement output transistor 102 serves as a source follower. A load 104 is coupled between the output terminal 103 and the second power supply line 105a.

An n-channel depletion transistor 108 is coupled as a shutdown transistor between a control terminal (gate) of the output transistor 102 and the output terminal 103.

A control (gate) potential is supplied to the control terminal (gate) of the output transistor 102 by a gate drive circuit 106 based on a control signal 107 which controls a conductive state/nonconductive state of the output transistor 102. The gate drive circuit 106 is operated in response to a voltage supplied between the first power supply line 101a and a third power supply line 126a. The third power supply line 126a is coupled to the negative terminal of the battery through a third power supply terminal 126. Thus the gate drive circuit 106 is operated at nearly a battery voltage. Incidentally, the second power supply terminal 105 and the third power supply terminal 126 are frequently connected to different nodes in an automotive electrical system apart from each other. Thereby voltage deference of about 2 V may occur between the second power supply line 105a and the third power supply line 126a.

Figure 2:
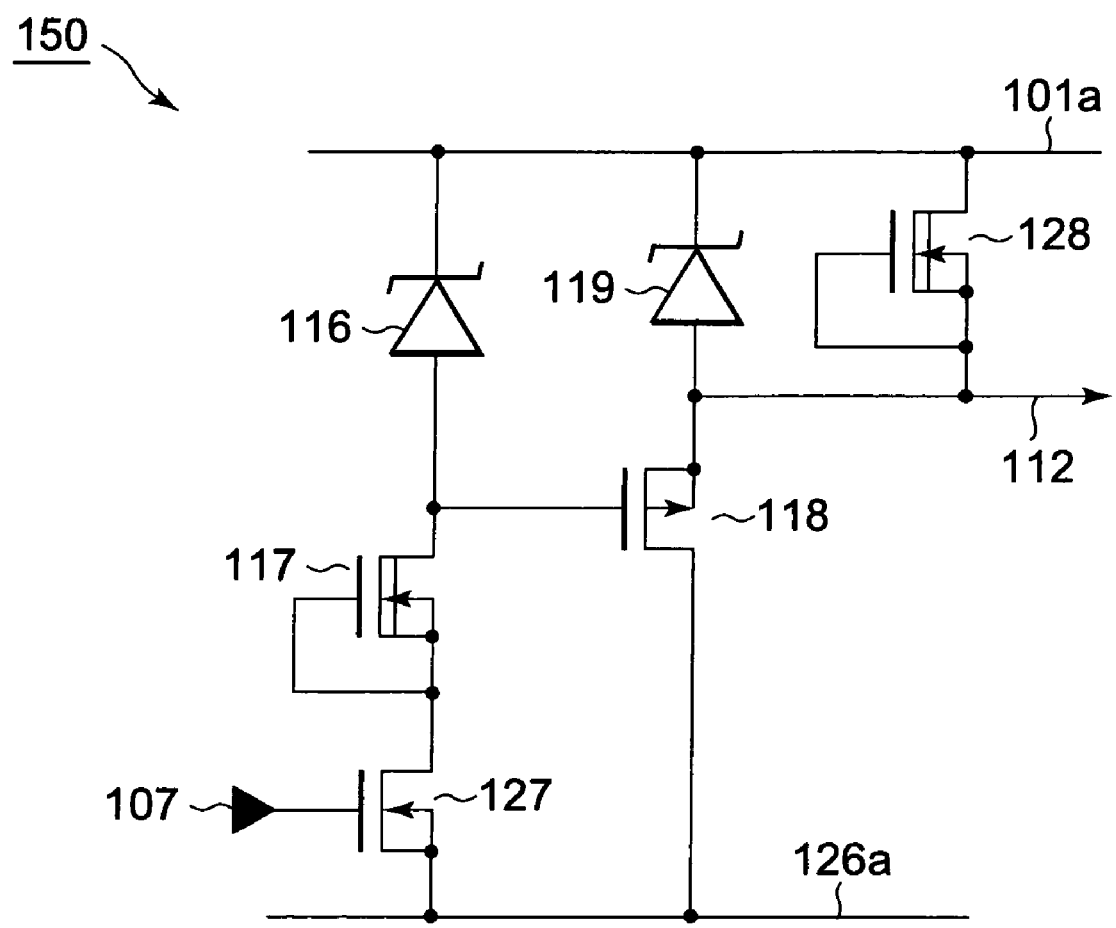
FIG. 2 is a circuit diagram illustrating an intermediate voltage generating circuit 150 of FIG. 1.

The voltage applied between the first power supply line 101a and the third power supply line 126a is further supplied to an intermediate voltage generating circuit 150. As illustrated in FIG. 2, the intermediate voltage generating circuit 150 includes an n-channel enhancement transistor 127 receiving the control signal 107 at its control terminal (gate), n-channel depletion transistors 117 and 128 serving as constant current devices, a p-channel enhancement transistor 118, and two zener diodes 116 and 119, and is coupled between the first power supply line 101a and the third power supply line 126a as illustrated in FIG. 2. As a result, an intermediate voltage which will be described later appears in an intermediate voltage line 112.

The control signal 107 is further supplied to a complementary metal-oxide semiconductor (CMOS) inverter 113. The inverter 113 is operated with the first power supply line 101a and the intermediate voltage line 112 as an operating power supply. An output of the inverter 113 is supplied to a control terminal (gate) of a p-channel enhancement transistor 111. An n-channel depletion transistor 110 is coupled as a constant current device between the transistor 111 and the output terminal 103.

A control terminal (gate) of the depletion transistor 108 serving as the shutdown transistor is coupled to a node between the transistor 110 and the transistor 111.

In this manner, the inverter 113, the transistor 110, and the transistor 111 form a control circuit which controls a voltage applied between the gate and the source of the depletion transistor 108 serving as the shutdown transistor. A control range thereof is, which will be apparent from the following description, a voltage smaller than a potential difference between the first power supply line 101a and the second power supply line 105a in both cases where the output transistor 102 is caused to be in the conductive state and to be in the nonconductive state. For example, the voltage applied between the gate and the source of the depletion transistor 108 is limited so as to be slightly a half of a battery voltage (for example, 12 V) at the maximum.

Next, an operation of the semiconductor output circuit 100 will be described in detail. Here, in the semiconductor output circuit 100, there are a conductive mode in which the output transistor 102 is in the conductive state to supply power to the load 104, and a nonconductive mode in which the output transistor 102 is in the nonconductive state. The operation of the semiconductor output circuit 100 will be described separately according to those two modes.

First, in the conductive mode, when the control signal 107 is at a high level, the gate drive circuit 106 is driven so as to cause the output transistor 102 to be in the conductive state, and in order to cause the output transistor 102 to be in the conductive state by a lower channel resistance, is driven so as to increase a potential of an output node of the gate drive circuit 106 to a potential at which a potential of the first power supply line 101a is boosted.

The control signal 107 at the high level is inverted by the inverter 113, but the inverter 113 uses the first power supply line 101a and the intermediate voltage line 112 as the operating power supply. Thus, an output of the inverter 113 becomes a potential of the intermediate voltage line 112, and the potential is supplied to a control terminal (gate) of the transistor 111.

On this occasion, in the intermediate voltage generating circuit 150 (of FIG. 2), the transistor 127 is caused to be in the conductive state by the control signal 107 at the high level, and a control terminal (gate) of the transistor 118 is biased with a potential obtained by subtracting a value of a voltage drop (for example, 6 V) of the zener diode 116 from the potential of the first power supply line 101a. The transistor 118 is operated as the source follower, and hence, assuming that a threshold voltage of the transistor 118 is Vtp, a potential of "(a potential of the first power supply line 101a)−6 V+Vtp" is output to the intermediate voltage line 112. It should be noted that the zener diode 119 is operated as a protection device for preventing the voltage difference applied between the potential of the first power supply line 101a and the potential of the intermediate voltage line 112 from being larger than 6 V.

At an early stage of a turn-on of the output transistor 102, a potential of the output terminal 103 is substantially equal to a ground potential, which is lower than a potential of the intermediate voltage line 112. Therefore, a node between the transistor 111 and the transistor 110 side functions as the drain of the transistor 111, and an intermediate voltage line 112 side thereof functions as the source. On this occasion, the gate of the transistor 111 is biased with the potential of the intermediate voltage line 112 as described above, with the result that the transistor 111 is caused to be in the nonconductive state.

As a result, a gate potential of the depletion transistor 108 becomes a potential of the output terminal 103 by the depletion transistor 110. A source potential of the depletion transistor 108 is also the potential of the output terminal 103, with the result that the depletion transistor 108 is in the conductive state.

Thus, a part of the output from the gate drive circuit 106 flows into the output terminal 103 through the depletion transistor 108. However, in this case, the depletion transistor 108 shows a constant current characteristic, and a driving ability of the gate drive circuit 106 is sufficiently larger, whereby the gate potential of the output transistor 102 is increased to be brought into the conductive state. Accordingly, power supply to the load 104 is started.

The conductive state of the depletion transistor 108 continues until the potential of the output terminal 103 is increased approximately to a value of "(the potential of the intermediate voltage line 112)+(a threshold voltage of the transistor 111)+2 V".

When the potential of the output terminal 103 is larger than the above-mentioned potential, the transistor 111 is operated as the source follower, and the gate of the depletion transistor 108 is supplied with a potential of "(the potential of the intermediate voltage line 112 (potential output from the inverter 113 on this occasion))+(the threshold voltage of the transistor 111)". As a result, the gate potential of the depletion transistor 108 becomes sufficiently lower than the source potential thereof (that is, potential of the output terminal 103), with the result that the depletion transistor 108 is cut off to be in the nonconductive state.

As a result, the charge supplied from the gate drive circuit 106 is all accumulated in the gate of the output transistor 102, and hence the gate potential of the output transistor 102 becomes sufficiently higher compared with that of the first power supply line 101a, and the output transistor 102 is brought into a triode region to have a smaller resistance. Accordingly, the potential of the output terminal 103 is substantially equal to the potential of the first power supply line 101a.

Then, the control signal 107 becomes a low level in the nonconductive mode. As a result, the gate drive circuit 106 starts discharging a gate charge of the output transistor 102. Instead of discharging, an output of the gate drive circuit 106 may be in a high impedance state.

On the other hand, in the intermediate voltage generating circuit 150 (of FIG. 2), the transistor 127 enters the nonconductive state by the control signal 107 at the low level, and a gate potential of the transistor 118 is made substantially equal to the potential of the first power supply line 101a. The transistor 118 also enters the nonconductive state, and the potential of the intermediate voltage line 112 is substantially pulled up to the potential of the first power supply line 101a by the depletion transistor 128 serving as the constant current device.

The control signal 107 at the low level is also supplied to the inverter 113, and as described above, the potential of the intermediate voltage line 112 on this occasion is substantially equal to the potential of the first power supply line 101a, with the result that the potential substantially equal to that of the first power supply line 101a is output as an output signal of the inverter 113.

In this manner, the gate potential and the source potential of the transistor 111 become substantially equal to the potential of the first power supply line 101a, and hence the transistor 111 enters the nonconductive state. Accordingly, the gate potential of the depletion transistor 108 becomes substantially equal to the potential of the output terminal 103 by the depletion transistor 110.

The gate potential and the source potential of the depletion transistor 108 are substantially equal to each other, and the depletion transistor 108 enters the conductive state, whereby the gate charge of the output transistor 102 is discharged to the output terminal 103.

Even when the gate charge of the output transistor 102 is completely discharged, the gate of the output transistor 102 and the output terminal 103 are caused to be in a short-circuited state by the depletion transistor 108, whereby the nonconductive state of the output transistor 102 is maintained even when the potential fluctuation occurs in the output terminal 103. Moreover, on this occasion, there is no path through which current flows from the first power supply line 101a to the output terminal 103, and thus the stand-by current does not flow. Further, there is also no path in the intermediate voltage generating circuit 150 and a control circuit including the inverter 113 and transistors 111 and 110 during being turned off the output transistor 102, through which the stand-by current flows.

As described above, in the semiconductor output circuit 100, during a period when the output transistor 102 is shifted from the nonconductive state to the conductive state and a period when the output transistor 102 is maintained in the conductive state, the voltage applied between the gate and the source of the depletion transistor 108 is equal to a potential difference between a potential of the intermediate voltage line 112 and a potential of the output terminal 103. The maximum value of the voltage applied between the gate and the source of the depletion transistor 108 on this occasion is a value of "(the potential of the first power supply line 101a)−6 V+(the threshold voltage Vtp of the transistor 118)+(the threshold voltage of the transistor 111)". According to the operation described above, the voltage applied between the gate and the source of the depletion transistor 108 is nearly zero because of the depletion transistor 110 when the transistor 111 is in the nonconductive state, and is a value of voltage drop (2 V, for example) occurring in the depletion transistor 110 when the transistor 111 is in the conductive state.

On the other hand, during periods when the output transistor 102 is shifted from the conductive state to the nonconductive state and is maintained in the nonconductive state, the gate potential and the source potential of the depletion transistor 108 are substantially equal to each other. In other words, even in the cases where the depletion transistor 108 is in the conductive state and is in the nonconductive state, the voltage applied between the gate and the source of the depletion transistor 108 is within a range of voltage difference smaller than a battery voltage (voltage difference applied between the first power supply line 101a and the second power supply line 105a) by the intermediate voltage generating circuit 150 and the control circuit including the inverter 113 and the transistors 110 and 111. Thus, a device having a lower breakdown voltage can be used as the depletion transistor 108, which contributes to a reduction in chip area in the case where the device is constructed into an integrated circuit.

It should be noted that, in the description above, it is possible to appropriately substitute a resistor for the constant current device. In other words, a so-called impedance device can be used. Moreover, the number of constant current devices, the number of zener diodes, and a zener voltage thereof, which are required in accordance with a circuit constant, can be appropriately changed.

Figure 3:
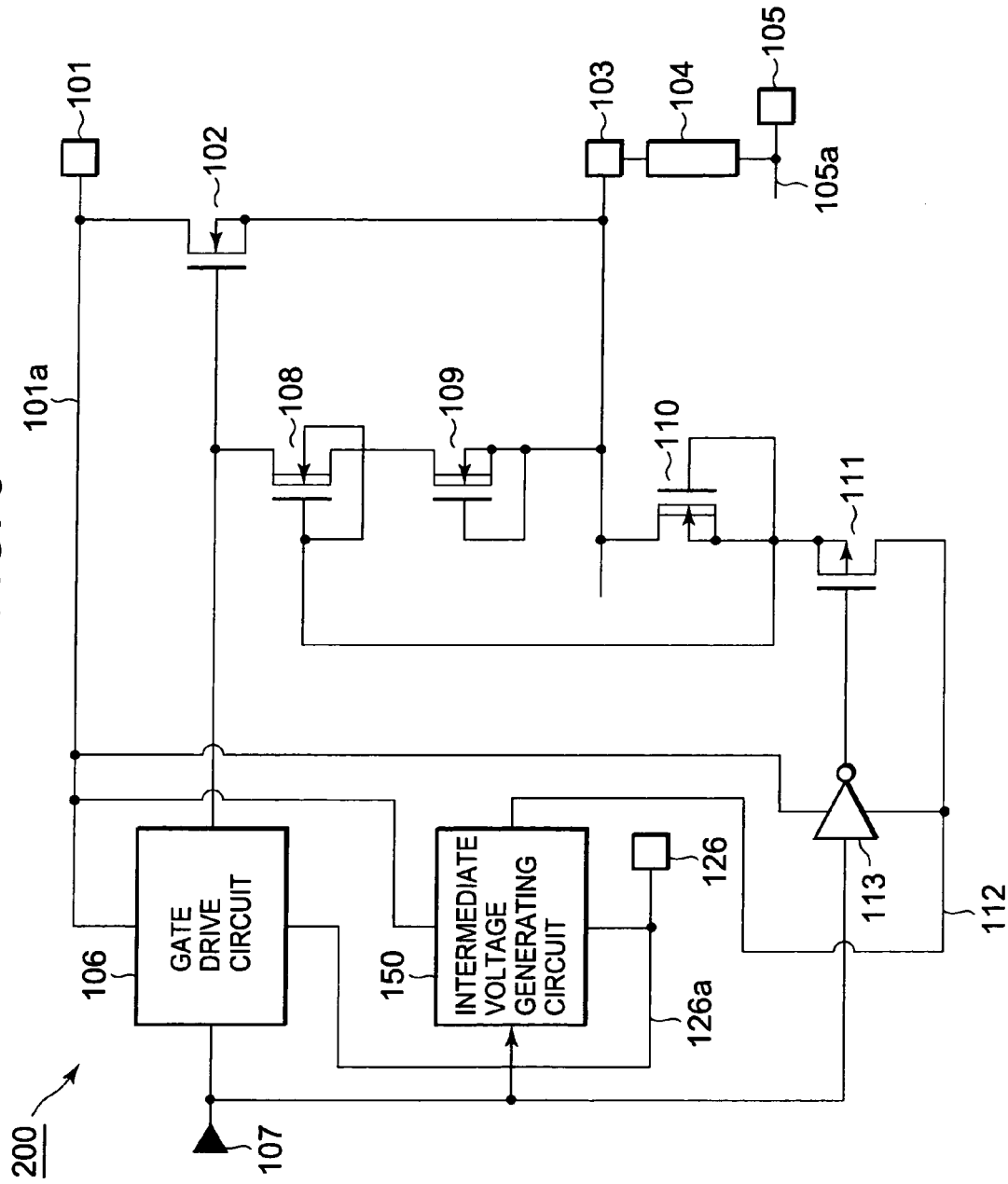
FIG. 3 is a circuit diagram of a semiconductor output circuit 200 according to a second embodiment of the present invention.

FIG. 3 illustrates a semiconductor output circuit 200 according to a second embodiment of the present invention. The same components as those of FIG. 1 are denoted by the same reference symbols, and their descriptions will be omitted.

In the semiconductor output circuit 200, a control terminal (gate) and a substrate terminal (back gate) of the depletion transistor 108 are commonly connected, and further, an n-channel depletion transistor 109 serving as the constant current source is provided between the depletion transistor 108 and the output terminal 103. The constant current source (depletion transistor 109) may be coupled between the gate of the output transistor 102 and the depletion transistor 108.

A depletion transistor enters the nonconductive state when the voltage applied between the gate and the source thereof reaches a so-called cut-off voltage, and an effective cut-off voltage thereof varies depending on a shape, size, or the like of the device. Thus, in the semiconductor output circuit 200, a potential of the substrate terminal (back gate) is also controlled as in the case of the gate potential, which makes turn-off of the depletion transistor 108 more reliable.

Further, in application to automotive electrical components, the load 104 contains an inductance component or requires driving of a lamp or the like at larger current in some cases, and hence the output transistor 102 is desirably turned off relatively gradually for suppressing occurrence of noise.

Therefore, when the depletion transistor 109 as the constant current source is provided, the gate charge of the output transistor 102 can be discharged at the constant current, with the result that noise generated upon turn-off of the output transistor 102 can be suppressed.

In order to reliably discharge the gate charge at the constant current, the gate charge of the output transistor 102 is desirably discharged predominantly by the depletion transistors 108 and 109. Therefore, it is desirable that an output of the gate drive circuit 106 be in the high impedance state in response to the low level of the control signal 107.

Figure 4:
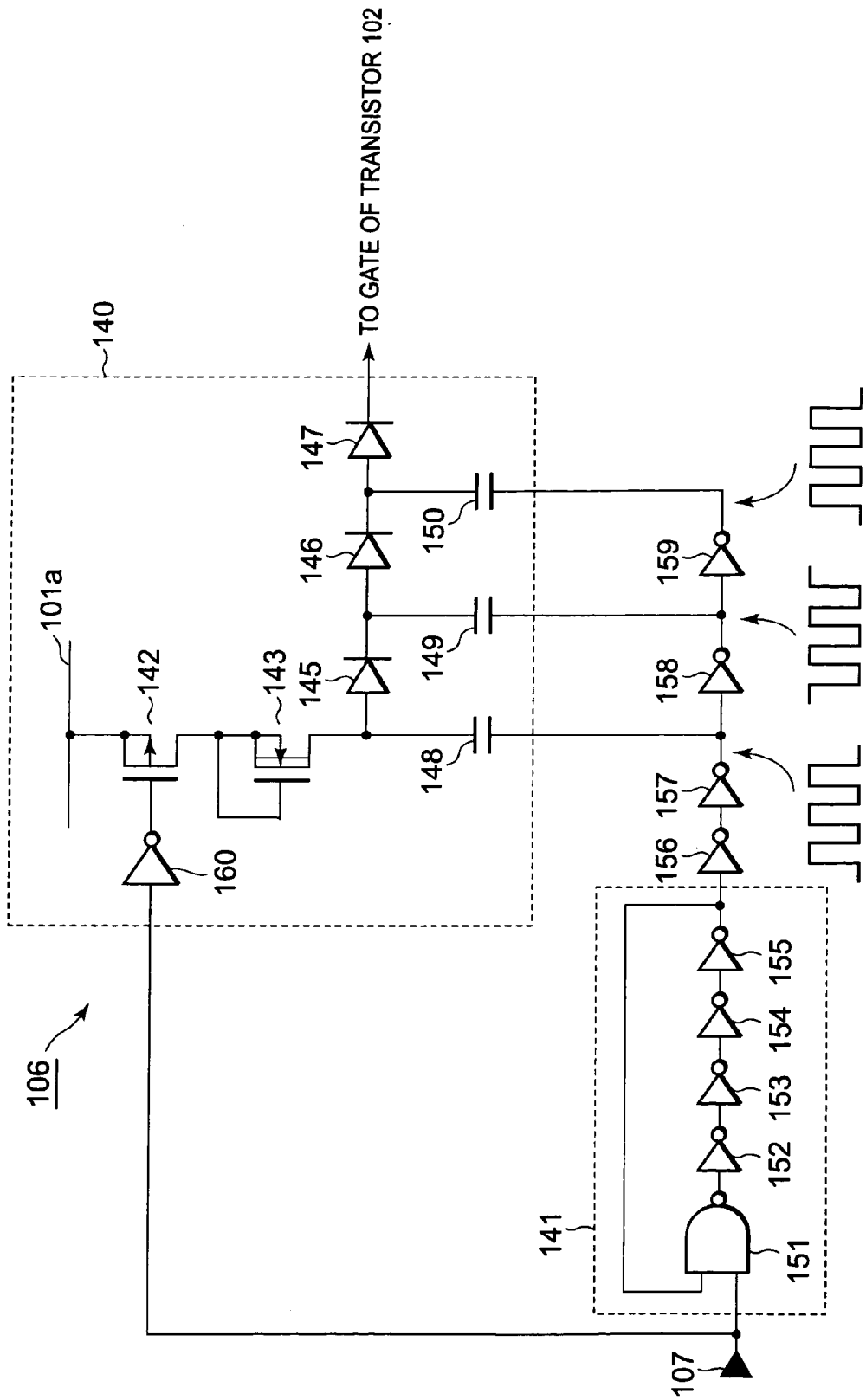
FIG. 4 is a circuit diagram illustrating a gate drive circuit 106 of FIG. 3.

FIG. 4 illustrates the gate drive circuit 106 for realizing the above. The gate drive circuit 106 of FIG. 4 includes a charge pump circuit 140, an oscillation circuit 141, and inverters 156 to 159 which supply the charge pump circuit 140 with an oscillation signal sent from the oscillation circuit 141 at an appropriate phase.

The oscillation circuit 141 includes a NAND gate 151 and four inverters 152 to 155, and is coupled as illustrated in FIG. 4. The charge pump circuit 140 includes an inverter 160, a p-channel transistor 142, an n-channel depletion transistor 143, three diodes 145 to 147, and three capacitors 148 to 150, and is coupled as illustrated in FIG. 4.

When the control signal 107 is at a high level, the oscillation circuit 141 starts an oscillation operation, and the charge pump circuit 140 is operated, whereby the gate of the output transistor 102 is supplied with a potential approximately three times the potential of the first power supply line 101$a$. In the case where the inverter 159, the capacitor 150, and the diode 147 are omitted, the gate of the output transistor 102 is supplied with a potential approximately twice the potential of the first power supply line 101$a$.

When the control signal 107 becomes a low level, the oscillation operation of the oscillation circuit 141 is stopped. Besides, the transistor 142 enters the nonconductive state, and accordingly, a cathode of the diode 147, namely, an output node of the gate drive circuit 106 enters the high impedance state.

In this manner, the gate charge of the output transistor 102 is discharged exclusively by the depletion transistors 108 and 109, and a discharging rate (voltage waveform) of the output transistor 102 can be determined by the depletion transistor 109 serving as the constant current source.

Figure 5:
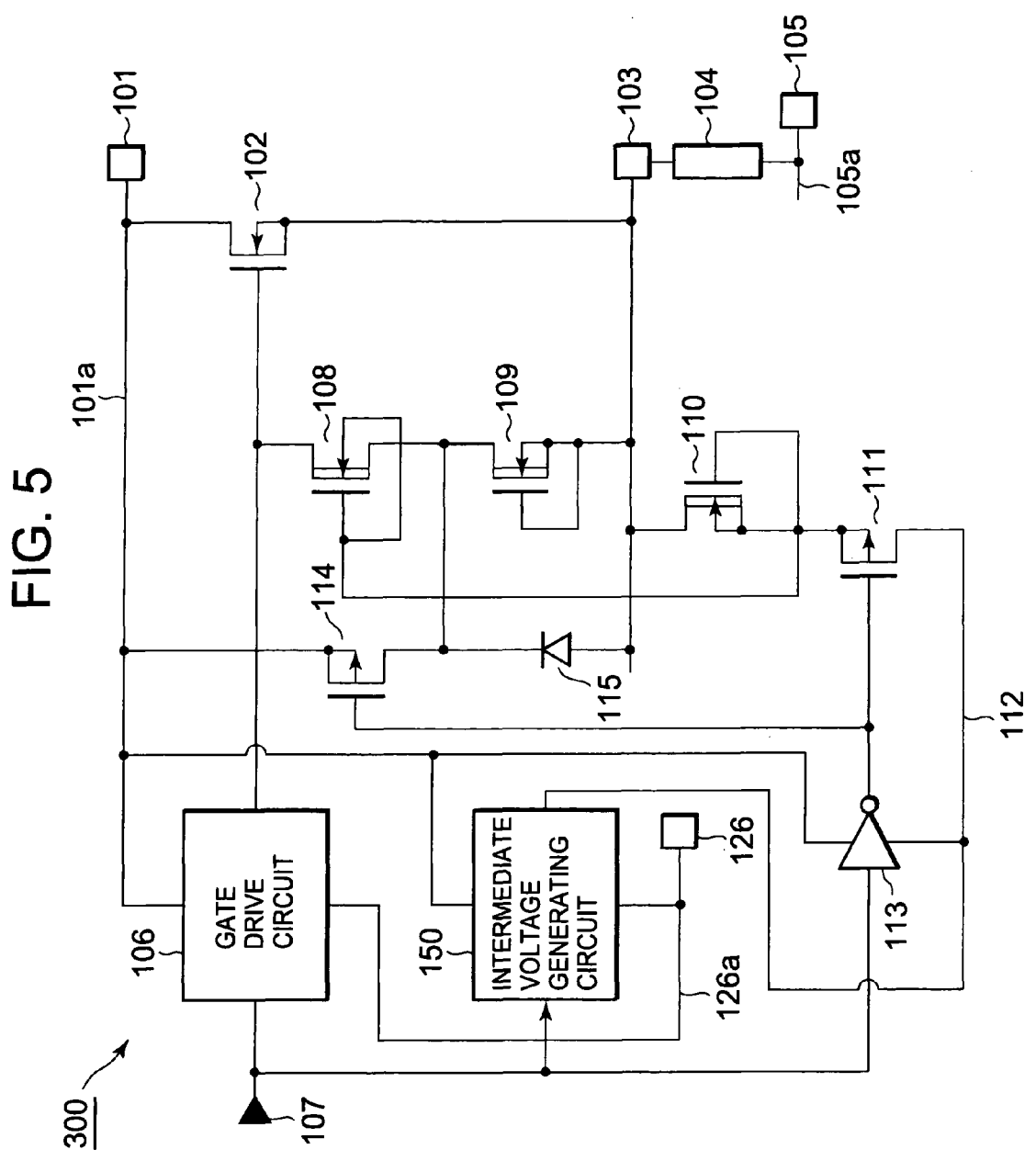

FIG. 5 illustrates a semiconductor output circuit 300 according to a third embodiment of the present invention. The same components as those of FIG. 2 are denoted by the same reference symbols.

In the semiconductor output circuit 300, in addition to the configuration of FIG. 2, there are further provided a p-channel enhancement transistor 114 and a zener diode 115 which are coupled in series between the first power supply line 101$a$ and the output terminal 103. A control terminal (gate) of the transistor 114 is coupled to the output node of the inverter 113, and a node between the transistor 114 and the zener diode 115 is coupled to a node between the depletion transistors 108 and 109. A zener voltage of the zener diode 115 is about 6 V.

In the conductive mode, the transistor 114 is in the conductive state, and the source potential of the depletion transistor 108 is substantially equal to a potential based on a zener voltage of the zener diode 115, namely the potential higher than the potential of the output terminal 103 by about 6 V. At a turn-on early stage of the output transistor 102 (that is, when the potential of the output terminal 103 is lower level and the transistor 111 is in the nonconductive state), the gate potential of the depletion transistor 108 is approximately equal to the potential of the output terminal 103, and the source potential of the depletion transistor 108 is approximately equal to the potential of the output terminal 103 due to the depletion transistor 109, whereby the depletion transistor 108 enters the nonconductive state. In other words, at the turn-on early stage of the output transistor 102, the depletion transistor 108 can be caused to be in the nonconductive state by the transistor 114 and the zener diode 115. Accordingly, even when the gate drive circuit 106 does not have a sufficient driving ability, the gate of the output transistor 102 can be supplied with a sufficient charge, and the potential of the output terminal 103 continues increasing.

After that, when the potential of the output terminal 103 is increased and becomes higher than the zener voltage of the zener diode 115, the source potential of the depletion transistor 108 becomes substantially equal to the potential of the first power supply line 101$a$. On this occasion, because the transistor 111 is in the conductive state, the gate potential and the substrate terminal (back gate) potential of the depletion transistor 108 is substantially equal to the potential related to the intermediate voltage line 112 at this stage, that is, a value of "(the potential of the first power supply line 101$a$)−6 V+(the threshold voltage Vtp of the transistor 118)+(the threshold voltage of the transistor 111)". In other words, the voltage between the gate and the source of the depletion transistor 108 is a value of "6 V−(the threshold voltage Vtp of the transistor 118)−(the threshold voltage of the transistor 111)". Moreover, the depletion transistor 108 remains in the nonconductive state.

Further, when an n-channel metal-oxide semiconductor field-effect transistor (MOSFET) having a lower breakdown voltage structure is used for the depletion transistor 108, the zener diode 115 functions also as the protective device between the substrate terminal (back gate) and the source.

On the other hand, in the nonconductive mode of the output transistor 102, the transistor 114 is in the nonconductive state. Thus, the semiconductor output circuit 300 is operated as in the semiconductor output circuit 200, and the stand-by current does not flow.

As described above, the depletion transistor can be used as the shutdown transistor, and the voltage range applied between the gate and the source for controlling the conductive/nonconductive state thereof can be limited, whereby the device having a relatively lower breakdown voltage can be used as the shutdown transistor. In addition, an occurrence of the stand-by current can be prevented.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor output circuit, comprising:
a first power supply line;
an output terminal to be coupled to a second power supply line through a load;
an output transistor coupled between the first power supply line and the output terminal;
a depletion transistor coupled between a control terminal of the output transistor and the output terminal, wherein a voltage applied between a gate and a source of the depletion transistor is smaller than a voltage difference between a potential of the first power supply line and a potential of the second power supply line when the output transistor is in a conductive state and a nonconductive state;
an intermediate voltage generating circuit generating an intermediate potential between the potential of the first power supply line and the potential of the second power supply line to an intermediate voltage line; and a control circuit which causes the gate of the depletion transistor to have a potential related to the intermediate voltage in a case of causing the output transistor to be in the conductive state, and couples the gate and the source of the depletion transistor in a case of causing the output transistor to be in the nonconductive state.

2. A semiconductor output circuit according to claim 1, wherein:
the output transistor is driven in response to a control signal; and
the control circuit comprises:
a series circuit of a switch transistor and an impedance device, which are coupled between the intermediate voltage line and the output terminal; and
an inverter which is operated at a voltage between the potential of the first power supply line and the intermediate potential of the intermediate voltage line, and inverts the control signal to supply the inverted control signal to a gate of the switch transistor.

3. A semiconductor output circuit according to claim 2, wherein the switch transistor of the control circuit is defined as a first switch transistor, the control circuit further comprising:
a series circuit of a second switch transistor and a constant voltage device, which are provided between the first power supply line and the output terminal,
wherein
an output of the inverter is supplied to a gate of the second switch transistor, and
a node between the second switch transistor and the constant voltage device is coupled to the source of the depletion transistor.

4. A semiconductor output circuit according to claim 1, wherein the depletion transistor has a substrate terminal coupled to the gate thereof.

5. A semiconductor output circuit according to claim 1, further comprises a constant current source device provided in series with the depletion transistor between the control terminal of the output transistor and the output terminal.

6. A semiconductor output circuit according to claim 5, wherein the constant current source device comprises a depletion transistor.

7. A semiconductor output circuit according to claim 1, wherein:
the output transistor is driven by a gate drive circuit; and
an output of the gate drive circuit becomes a high impedance state when the output transistor is shifted from the conductive state to the nonconductive state.

8. A semiconductor output circuit according to claim 7, wherein the gate drive circuit generates a potential higher than a potential of the first power supply line in response to the control signal which causes the output transistor to be in the conductive state.

9. A semiconductor output circuit, comprising:
a first power supply line;
an output terminal to be coupled to a second power supply line through a load;
an output transistor coupled between the first power supply line and the output terminal;
a depletion transistor coupled between a control terminal of the output transistor and the output terminal, wherein a voltage applied between a gate and a source of the depletion transistor is smaller than a voltage difference between a potential of the first power supply line and a potential of the second power supply line when the output transistor is in a conductive state and a nonconductive state; and
a constant current source device provided in series with the depletion transistor between the control terminal of the output transistor and the output terminal, wherein the constant current source device comprises a depletion transistor.

10. A semiconductor output circuit according to claim 9, further comprising:
an intermediate voltage generating circuit generating an intermediate potential between the potential of the first power supply line and the potential of the second power supply line to an intermediate voltage line; and
a control circuit which causes the gate of the depletion transistor to have a potential related to the intermediate voltage in a case of causing the output transistor to be in the conductive state, and couples the gate and the source of the depletion transistor in a case of causing the output transistor to be in the nonconductive state,
wherein:
the output transistor is driven in response to a control signal; and
the control circuit comprises:
a series circuit of a switch transistor and an impedance device, which are coupled between the intermediate voltage line and the output terminal; and
an inverter which is operated at a voltage between the potential of the first power supply line and the intermediate potential of the intermediate voltage line, and inverts the control signal to supply the inverted control signal to a gate of the switch transistor.

11. A semiconductor output circuit according to claim 10, wherein the switch transistor of the control circuit is defined as a first switch transistor, the control circuit further comprising:
a series circuit of a second switch transistor and a constant voltage device, which are provided between the first power supply line and the output terminal,
wherein
an output of the inverter is supplied to a gate of the second switch transistor, and
a node between the second switch transistor and the constant voltage device is coupled to the source of the depletion transistor.

12. A semiconductor output circuit according to claim 9, wherein the depletion transistor has a substrate terminal coupled to the gate thereof.

13. A semiconductor output circuit according to claim 9, wherein:
the output transistor is driven by a gate drive circuit; and
an output of the gate drive circuit becomes a high impedance state when the output transistor is shifted from the conductive state to the nonconductive state.

14. A semiconductor output circuit according to claim 13, wherein the gate drive circuit generates a potential higher than a potential of the first power supply line in response to the control signal which causes the output transistor to be in the conductive state.

15. A semiconductor output circuit, comprising:
a first power supply line;
an output terminal to be coupled to a second power supply line through a load;
an output transistor coupled between the first power supply line and the output terminal;
a depletion transistor coupled between a control terminal of the output transistor and the output terminal;
an intermediate voltage generating circuit generating an intermediate potential between a potential of the first power supply line and a potential of the second power supply line to an intermediate voltage line; and a control circuit coupling a gate of the depletion transistor to the intermediate voltage line when the output transistor is in a conductive state or coupling the gate of the depletion transistor to the output terminal when the output transistor is in a nonconductive state.

16. A semiconductor output circuit according to claim 15, wherein:

the output transistor is driven in response to a control signal; and the control circuit comprises:

a series circuit of a switch transistor and an impedance device, which are coupled between the intermediate voltage line and the output terminal; and an inverter which is operated at a voltage between the potential of the first power supply line and the intermediate potential of the intermediate voltage line, and inverts the control signal to supply the inverted control signal to a gate of the switch transistor.

17. A semiconductor output circuit according to claim 16, wherein the switch transistor of the control circuit is defined as a first switch transistor, the control circuit further comprising:

a series circuit of a second switch transistor and a constant voltage device, which are provided between the first power supply line and the output terminal, wherein an output of the inverter is supplied to a gate of the second switch transistor, and a node between the second switch transistor and the constant voltage device is coupled to the source of the depletion transistor.

18. A semiconductor output circuit according to claim 15, wherein the depletion transistor has a substrate terminal coupled to the gate thereof.

19. A semiconductor output circuit according to claim 15, further comprising a constant current source device provided in series with the depletion transistor between the control terminal of the output transistor and the output terminal.

* * * * *